(12) United States Patent
Willmeroth et al.

(10) Patent No.: US 8,324,686 B2
(45) Date of Patent: Dec. 4, 2012

(54) SEMICONDUCTOR DEVICE AND METHOD FOR MANUFACTURING

(75) Inventors: Armin Willmeroth, Augsburg (DE);
Carolin Tolksdorf, Steinhoering (DE)

(73) Assignee: Infineon Technologies Austria AG, Villach (AT)

( * ) Notice: Subject to any disclaimer, the term of this patent is extended or adjusted under 35 U.S.C. 154(b) by 718 days.

(21) Appl. No.: 12/355,369

(22) Filed: Jan. 16, 2009

(65) Prior Publication Data

US 2010/0181627 A1    Jul. 22, 2010

(51) Int. Cl.
*H01L 27/12*        (2006.01)
*H01L 21/20*        (2006.01)

(52) U.S. Cl. . 257/350; 257/358; 257/516; 257/E29.324; 257/E21.003; 439/382; 439/598

(58) Field of Classification Search ............... 257/173, 257/355, 356, 358, 359, 362, 379, 382, 536, 257/597, E23.142, E27.016, E21.002, 328, 257/329, 330, 331, 334, 337, 503, E23.015, 257/E21.523, E21.59, 350, 390, 516, E27.017, 257/E27.024; 438/382, 597, 598, 599, 602, 438/171, 190, 210, 238, 329, 330, 332, 381, 438/FOR. 429

See application file for complete search history.

(56) References Cited

U.S. PATENT DOCUMENTS

| | | | | |
|---|---|---|---|---|
| 5,108,945 A * | 4/1992 | Matthews | | 438/384 |
| 5,592,006 A | 1/1997 | Merrill | | |
| 2004/0262678 A1* | 12/2004 | Nakazawa et al. | | 257/330 |
| 2007/0252168 A1* | 11/2007 | Shimoida et al. | | 257/147 |

* cited by examiner

*Primary Examiner* — Olik Chaudhuri
*Assistant Examiner* — Quovaunda V Jefferson
(74) *Attorney, Agent, or Firm* — Dicke, Billig & Czaja, PLLC

(57) ABSTRACT

A semiconductor device and method for manufacturing. One embodiment provides a semiconductor device including an active cell region and a gate pad region. A conductive gate layer is arranged in the active cell region and a conductive resistor layer is arranged in the gate pad region. The resistor layer includes a resistor region which includes a grid-like pattern of openings formed in the resistor layer. A gate pad metallization is arranged at least partially above the resistor layer and in electrical contact with the resistor layer. An electrical connection is formed between the gate layer and the gate pad metallization, wherein the electrical connection includes the resistor region.

25 Claims, 12 Drawing Sheets

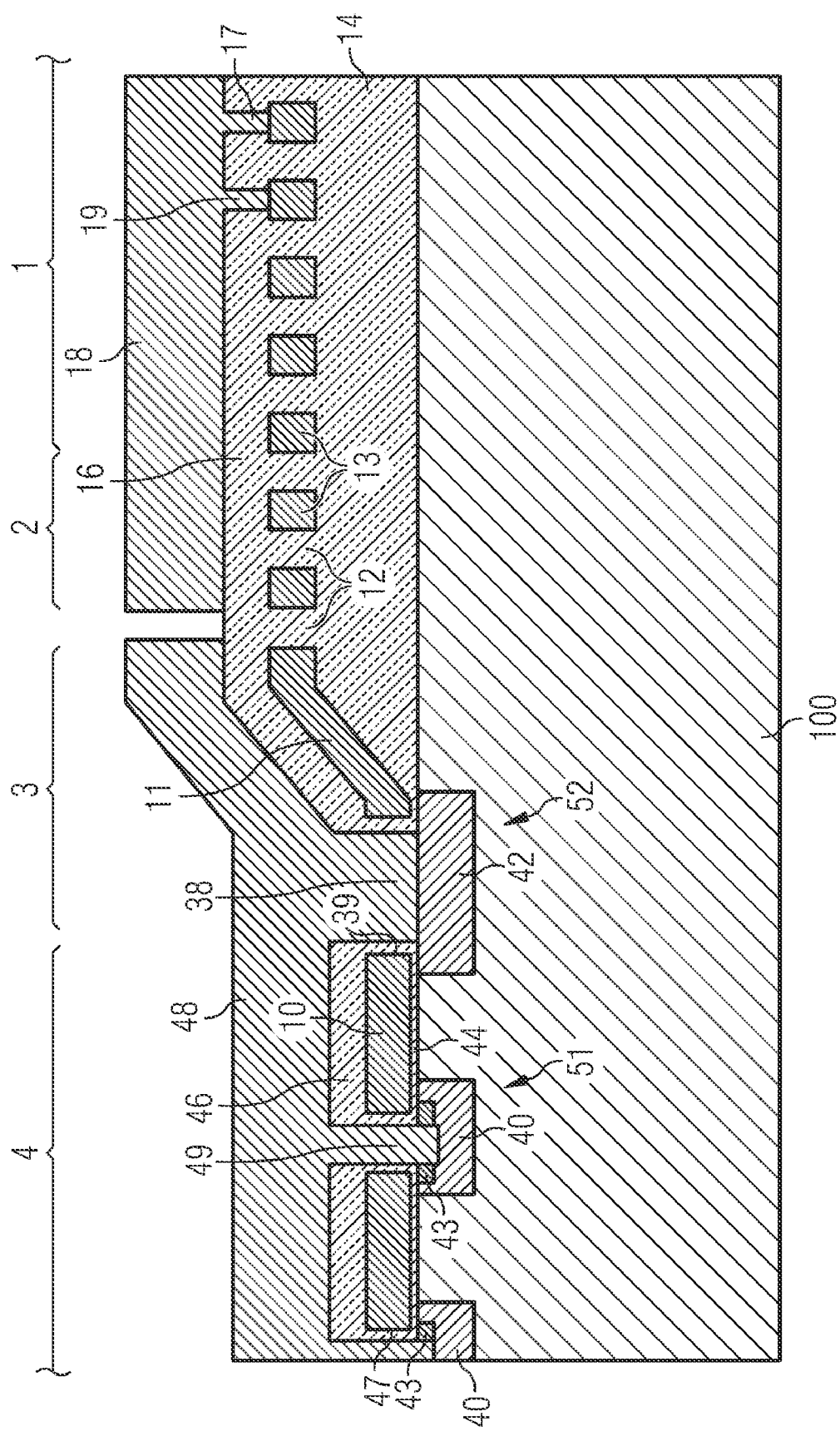

FIG 4A
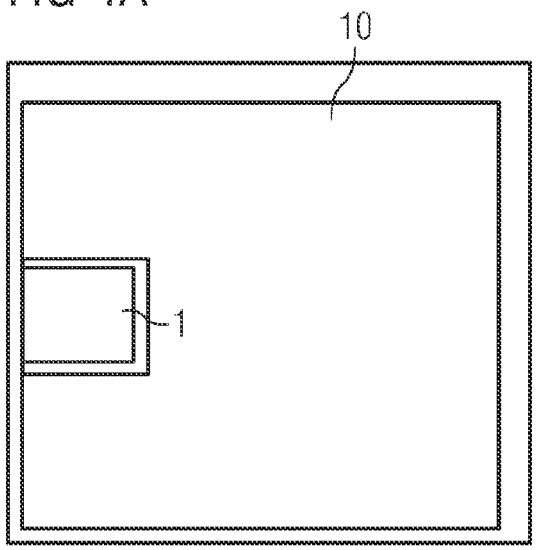
FIG 4B
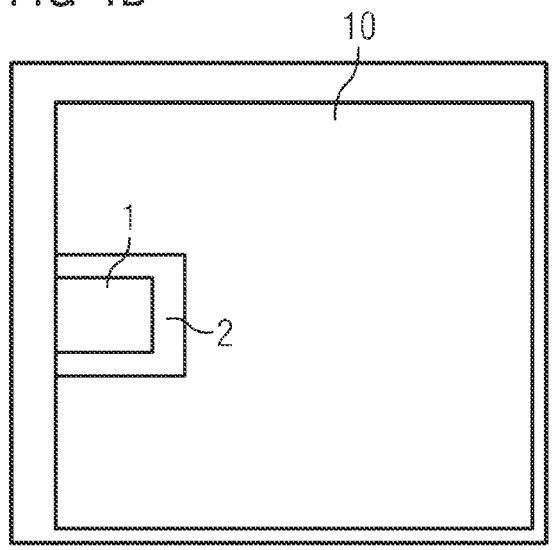
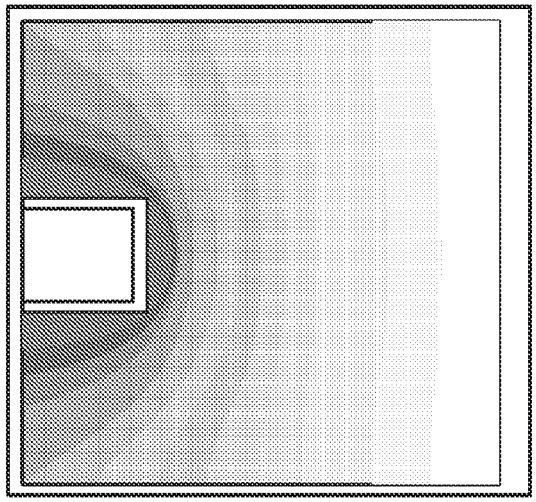
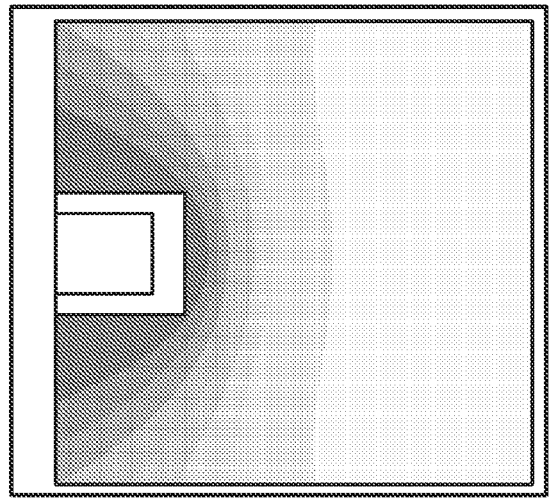

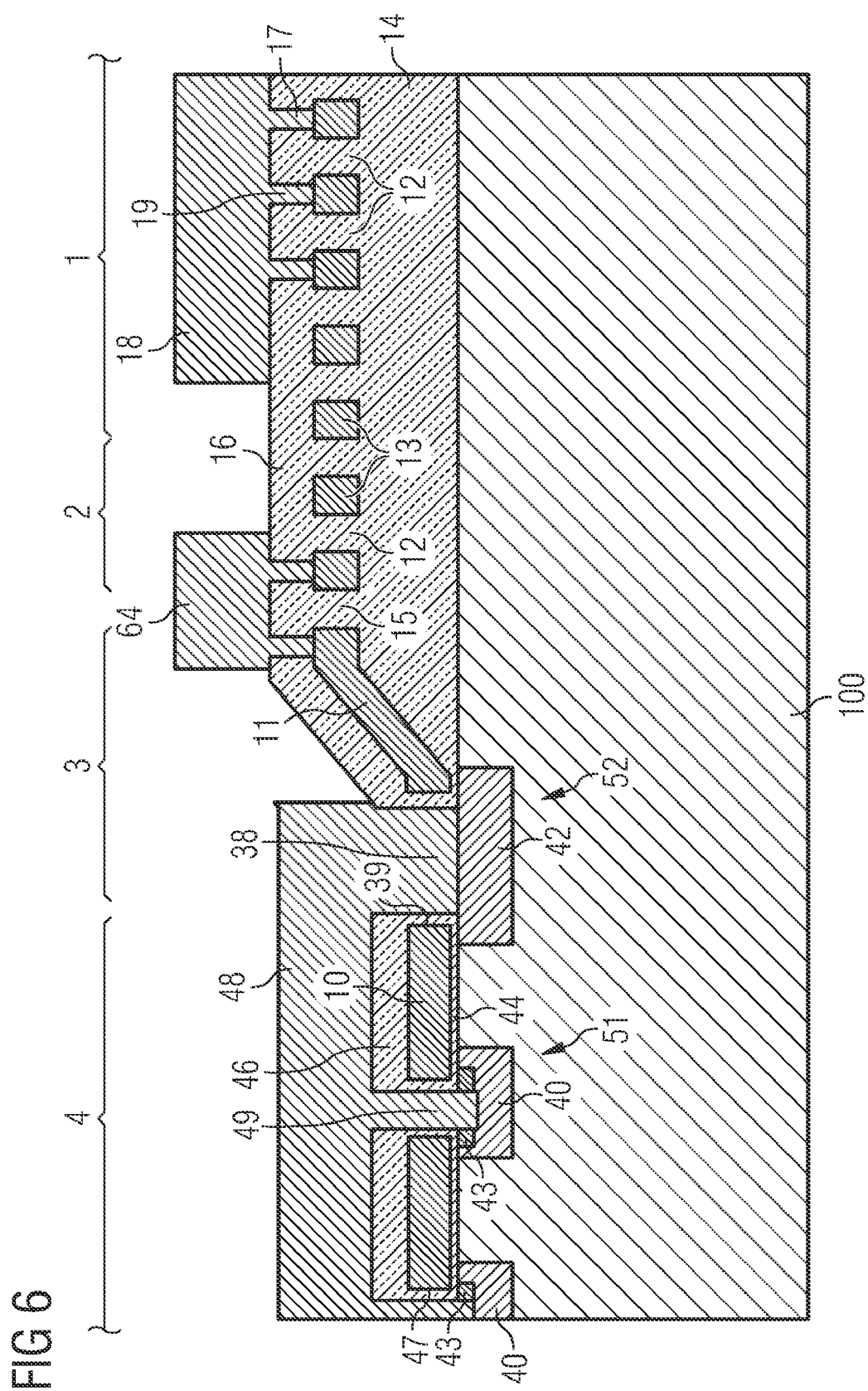

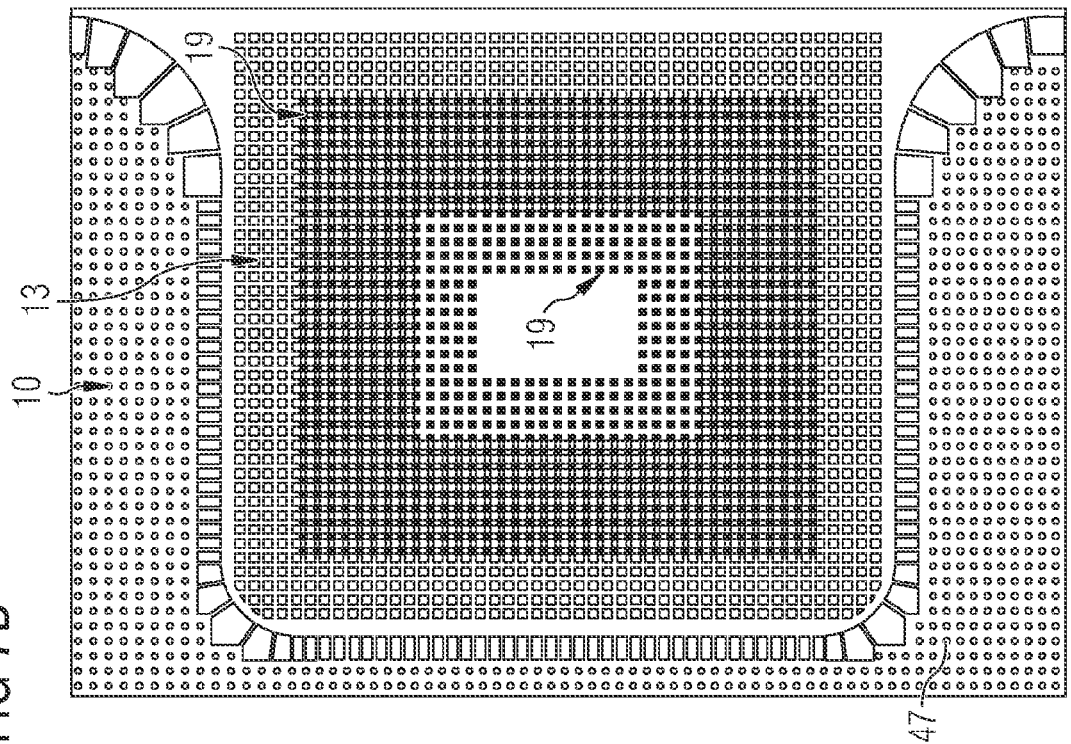
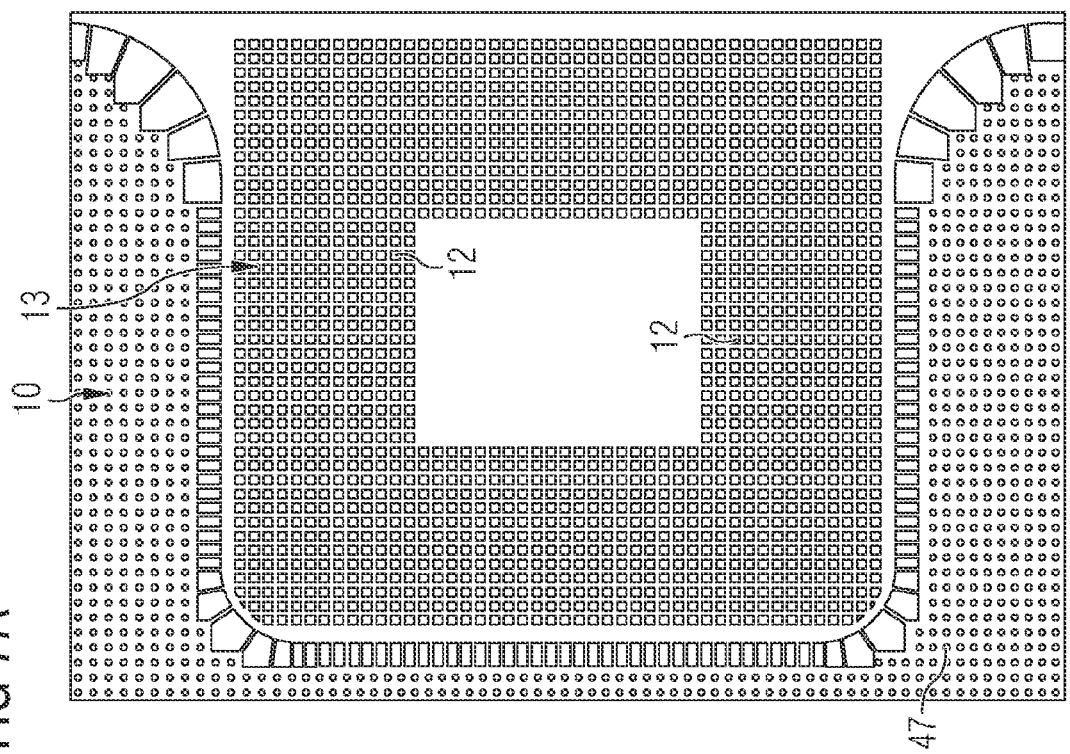

SEMICONDUCTOR DEVICE AND METHOD FOR MANUFACTURING

BACKGROUND

One or more embodiments relate to a gate connection structure, in one embodiment to a gate connection structure for use in a semiconductor device, for example, a power semiconductor device. Embodiments relate to semiconductor devices having a gate connection structure with an integrated gate resistor, in one embodiment an integrated sheet resistance.

Semiconductor devices such as compensation devices are used in a plurality of industrial fields. Compensation semiconductor devices are used, e.g., in applications requiring fast switching.

In general, compensation semiconductor devices such as CoolMOS are smaller than conventional MOSFETs, have smaller parasitic capacitances, and therefore offer a low specific switch-on resistance enabling fast and steep switching.

High voltage peaks may be generated at parasitic inductances during switching processes, and, together with parasitic capacitances, oscillations may be excited. Both effects may lead to the destruction of the semiconductor devices or, at least, to an adverse electromagnetic interference behaviour of the device.

It has been proposed to add capacitances for limiting the rates of chance in voltage and current. However, these proposals require increased complexity of the manufacturing process and often need additional chip area, both increasing the cost of the product. Also, an external gate resistance has been widely used for reducing oscillations.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 3A and 3B illustrate a top view and a cross-sectional view of a semiconductor device according to one or more embodiments.

FIG. 4A illustrates a simulation showing a voltage distribution in a gate layer of a semiconductor device during switching according to a reference device.

FIG. 4B illustrates a simulation showing a voltage distribution in a gate layer of a semiconductor device during switching according to one or more embodiments.

FIG. 6 illustrates a cross-sectional view of a semiconductor device with gate ring structure according to one or more embodiments.

FIGS. 7A and 7B illustrate a semiconductor device with an integrated gate resistor having a low resistance according to one or more embodiments.

DETAILED DESCRIPTION

Figure 1:
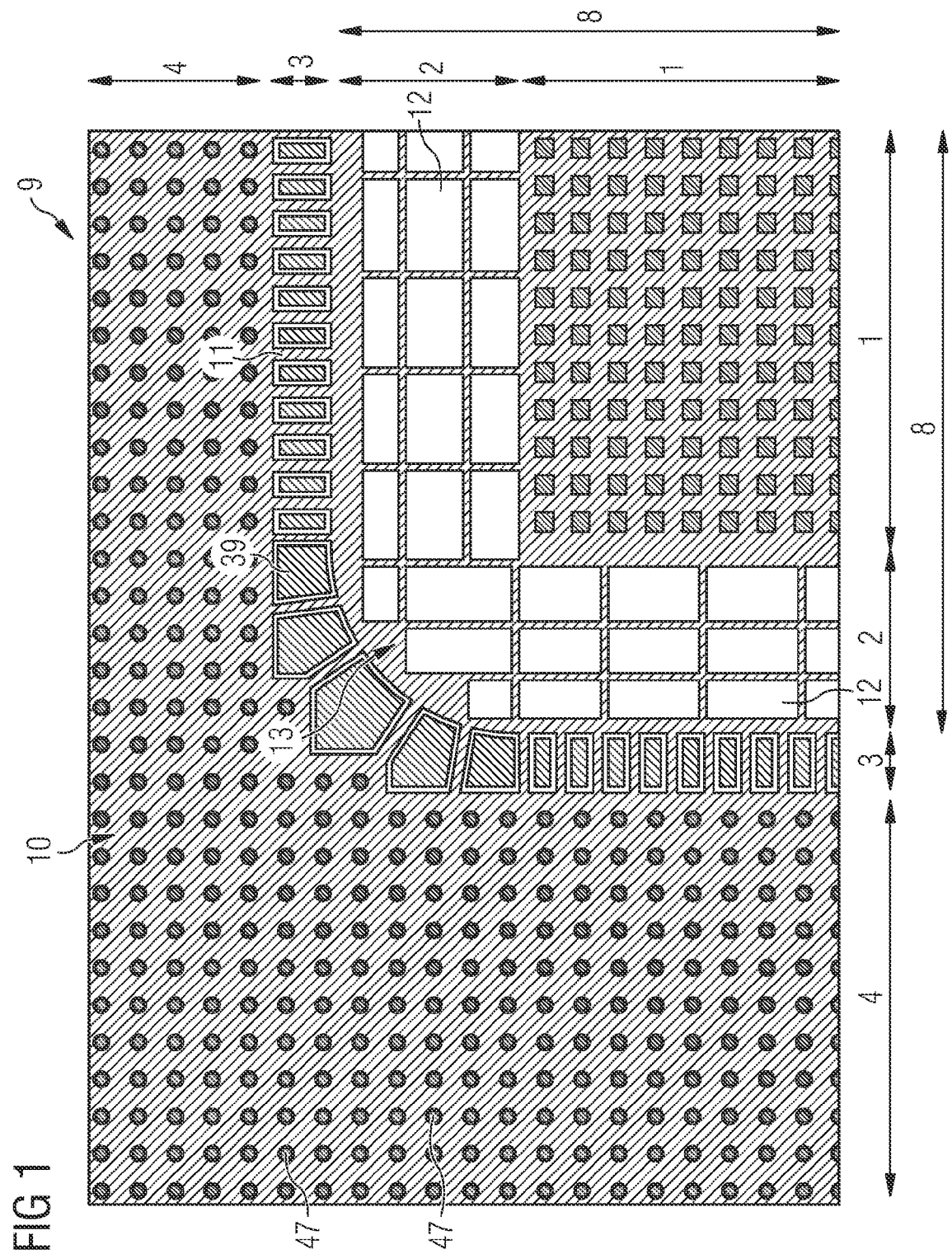
FIG. 1 illustrates a top view of a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

One or more embodiments will typically be described with reference to semiconductor devices, particularly to compensation semiconductor devices such as power field effect transistors like, e.g., the CoolMOS. However, diodes, bipolar transistors and insulated gate bipolar transistors (IGBTs) may be provided yielding further embodiments. One or more embodiments also refer to semiconductor devices having gate structures arranged in trenches formed in a semiconductor substrate.

Herein described are semiconductor devices, in one or more embodiments field-effect semiconductor devices, which include a gate resistor at least partially integrated in the gate pad region and a manufacturing method therefore. According to one or more embodiments, a semiconductor device is provided which includes an active cell region and a gate pad region. The semiconductor device further includes a conductive gate layer arranged in the active cell region and a conductive resistor layer arranged in the gate pad region. The resistor layer includes a resistor region which includes a grid-like pattern of openings formed in the resistor layer. A gate pad metallization can be arranged at least partially above the resistor layer and in electrical contact with the resistor layer. An electrical connection is formed between the gate layer and the gate pad metallization, wherein the electrical connection includes the resistor region. The grid-like pattern of openings can be, for example, a plurality of openings which are regularly arranged, for example, as array, hence covering an area having a certain extent. The type of arrangement is not restricted and can include a hexagonal configuration, square-like configuration or rectangular configuration to name few.

According to one or more embodiments, a semiconductor device is provided which includes an active cell region, a gate pad region, and an inactive cell region arranged between the active cell region and the gate pad region. A conductive gate layer is arranged in the active cell region. A gate connection structure is arranged in the gate pad region and includes a conductive resistor layer, a gate pad metallization and a gate pad insulating layer arranged between the resistor layer and the gate pad metallization. The resistor layer includes a grid-like pattern of openings formed in the resistor layer or structure. The gate pad insulating layer has at least one opening, in some embodiments a plurality of openings, defining a contact region of the resistor layer. The gate pad metallization is in electrical contact with the contact region through the at least one opening, in one or more embodiments through the plurality of openings. The grid-like pattern of openings forms at least a portion of an electrical connection between the gate layer and the contact region of the resistor layer.

According to one or more embodiments, a semiconductor device is provided which includes an active cell region, a gate pad region, and a conductive layer extending from the gate pad region to the active cell region and including a gate portion arranged in the active cell region and a resistor portion arranged in the gate pad region. The conductive layer may cover gate pad region and active cell region. The resistor portion includes an array of openings formed in the conductive layer. The array of openings defines an effective sheet resistance of the resistor portion which is higher than an effective sheet resistance of the gate portion. The semiconductor device further includes a gate pad metallization and a gate pad insulating layer between the resistor portion and the gate pad metallization. The insulating layer includes a plurality of conductive plugs forming an electrical connection between the resistor portion and the gate pad metallization. The resistor portion, particularly the array of openings, forms at least a portion of an electrical connection between the gate portion and the gate pad metallization.

According to one or more embodiments, a semiconductor device is provided which includes a plurality of field-effect transistor cells, a conductive gate layer forming respective gates of the respective field effect-transistor cells, a gate bonding pad, and an electrical connection between the gate layer and the gate bonding pad. The electrical connection includes a resistor structure having a grid-like pattern of openings formed in a resistor layer, wherein the grid-like pattern is at least partially arranged below the gate bonding pad.

According to one or more embodiments, a semiconductor device is provided which includes a semiconductor substrate having a plurality of field-effect transistor cells, a conductive gate layer forming respective gates of the respective field effect-transistor cells, a gate bonding pad, and an electrical connection between the gate layer and the gate bonding pad. A gate insulating layer having a first thickness is arranged between the gate layer and the semiconductor substrate. The electrical connection includes a resistor layer having a grid-like pattern of openings formed in the resistor layer, wherein the grid-like pattern is at least partially arranged below the gate bonding pad. A field insulating layer having a second thickness is arranged between the resistor layer and the semiconductor substrate, wherein the second thickness is larger than the first thickness. In one or more embodiments, the grid-like pattern is arranged completely on the field insulating layer.

According to one or more embodiments, a semiconductor device is provided which includes a conductive gate layer forming respective gates of the respective field effect-transistor cells, a gate bonding pad, and an electrical connection between the gate layer and the gate bonding pad. The electrical connection includes a resistor structure having an array of resistor openings formed in a resistor layer, wherein the array of resistor openings is at least partially arranged below the gate bonding pad. The gate layer includes a pattern of source contact openings. The size of the source contact openings is smaller than the size of the resistor openings. In one or more embodiments, the pattern of source contact openings has the same pitch as the pattern of resistor openings.

According to one or more embodiments, a semiconductor device is provided which includes a semiconductor substrate having a plurality of field-effect transistor cells, and a conductive layer formed on a surface of the semiconductor substrate and having at least a gate portion which forms respective gates of the respective field effect-transistor cells. The conductive layer includes a pattern of source contact openings formed in the gate portion. Conductive plugs which are insulated from the conductive layer extend through each of the source contact openings to contact respective source regions formed in the semiconductor substrate. The conductive layer further includes a resistor portion having a plurality of openings, wherein through at least a portion of these openings no conductive plugs extend. The openings are laterally surrounded by the material of the conductive layer so that the conductive layer remains connected.

According to one or more embodiments, a method of manufacturing a semiconductor device is provided. The method includes providing a semiconductor substrate having an active cell region and a gate pad region. A conductive gate layer is formed in the active cell region and a conductive resistor layer in the gate pad region. A grid-like pattern of openings is formed in the resistor layer for forming a resistor region or structure in the resistor region. An insulating layer is formed on the resistor region. At least one opening is formed in the insulating layer, wherein the at least opening defines a contact region of the resistor layer. A gate pad metallization is formed on the insulating layer in electrical contact with the contact region through the at least one opening. The gate pad metallization can be formed at least partially above the grid-like pattern of openings resistor layer.

In this specification, n-doped is referred to as first conductivity type while p-doped is referred to as second conductivity type. The semiconductor devices can be formed with opposite doping relations so that the first conductivity type can be p-doped and the second conductivity type can be n-doped.

According to one embodiment, a semiconductor device is provided which includes an active cell region and a gate pad region. The semiconductor device further includes a conductive gate layer arranged in the active cell region and a conductive resistor layer arranged in or near the gate pad region. The resistor layer includes a resistor region which includes a grid-like pattern of openings formed in the resistor layer. A gate pad metallization is arranged at least partially above the resistor layer and in electrical contact with the resistor layer. An electrical connection is formed between the gate layer and the gate pad metallization, wherein the electrical connection includes the resistor region.

FIG. 1 illustrates a top view of a semiconductor device 9 according to one or more embodiments. The semiconductor device 9 includes a semiconductor substrate, which is described in detail further below. The semiconductor device 9 further includes an active cell region 4, an optional inactive cell region 3, and gate pad region 8. The active cell region 4 includes at least one active cell, typically a plurality of substantially identical active cells. Each active cell has a gate electrode 10 as, for example, illustrated in FIG. 2B. The active cells may have different layouts such as a rectangular or hexagonal layout and may be of different types such as planar or vertical type. The term "planar type" and "vertical type" intends to describe the relative arrangement of the respective gates. Planar devices include gate electrodes, which are formed on a top or upper surface of the semiconductor substrate, so that respective channel regions formed next to the gate electrode extend in lateral direction. Vertical devices include gate electrodes formed on sidewalls of trenches, which extend vertically into the semiconductor substrate. The respective channel regions formed next to the vertical gate electrodes also extend in vertical direction. Typically, the semiconductor device 9 includes a plurality of substantially identical active cells, which are connected in parallel to allow switching of high currents.

The inactive cell region 3, which is formed in one or more embodiments between the gate pad region 8 and the active cell region 4, includes at least one inactive cell. Active cells 51 and inactive cells 52 are for instance illustrated in FIG. 6. Different to active cells 51, inactive cells 52 do not contribute to the load current flowing through the semiconductor device 9 but are designed to provide an edge region of the active cell region 4.

The gate pad region 8 includes a contact region 1 and a resistor region 2. The resistor region 2 includes an integrated gate resistor, the resistance of which can be tailored according to specific needs. Through contact region 1, the resistor region 2 is electrically connected to a gate pad metallization or gate bonding pad as described further below.

In one or more embodiments, a polysilicon layer forming a common conductive layer is formed on the semiconductor substrate and extends from the gate pad region 8 to the active cell region 4. The polysilicon layer, which is sometimes also referred to as Gate-Poly, includes a gate portion 10 extending in the active cell region 4 and a resistor portion 13 extending in the gate pad region 8. The gate portion 10 may include a regular pattern of openings 47 in the active cell region 4. These openings 47 are, for example, source contact openings which allow formation of electrical contacts to respective source regions of the active cells 51. Typically, respective conductive source plugs 49, illustrated, for example, in FIG. 2B, extend through each of the source contact openings 47 formed in the gate portion 10 of the common conductive layer. The conductive source plugs 49 are insulated from the gate portion 10. Common conductive layer may also be made of other conductive materials which are described further below.

The resistor portion 13 also includes a pattern of openings 12 formed in the common conductive layer. The openings 12 can be arranged in a grid-like manner as illustrated in FIG. 1. The openings 12 are formed in the resistor portion 13 to restrict the available cross-sectional area of resistor portion 13 for conducting a current, which leads to an increase of the resistance of resistor portion 13. In other words, by forming a plurality of openings in the resistor portion 13, the effective sheet resistance of the resistor portion 13 is increased in comparison with a layer having the same thickness and made of the same conductive material but without openings. Hence, a gate resistor is integrated into the common conductive layer by forming a plurality of openings 12 into the resistor portion 13.

The term effective sheet resistance of the structured or patterned resistor portion 13 intends to describe the "macroscopic" sheet resistance influenced by the pattern of openings, i.e. influenced by the reduction of the cross-sectional area. The "microscopic" sheet resistance, i.e. the sheet resistance of bars or stripes between adjacent openings is defined by the conductivity of the material used for forming the common conductive layer and its thickness.

In one or more embodiments, a regular pattern of openings 12 is used. This provides for a homogeneous effective sheet resistance in virtually any lateral directions of the resistor portion 13. For improving homogeneity, densely arranged openings of particular small size can be used. FIGS. 7A, 8A, 9A and 10A illustrate, for example, different types of dense grids according to certain embodiments. The shape, size and/or density of the openings can be selected according to specific needs. For example, if a very large effective sheet resistance is desired, densely arranged openings leaving only very small portions of conductive material between adjacent openings can be used. When using a constant grid width, i.e. a constant distance between central points of adjacent openings which is also referred to as pitch, the effective sheet resistance can be tailored by selecting the size of the openings which in turn determines the width of the bars or bridges left between adjacent openings. A skilled person will appreciate that the effective sheet resistance can generally be increased by increasing the amount of removed conductive material. For example, FIGS. 7A and 10A illustrate embodiments which differ from each other by the size of the openings whereas the width of the bars between adjacent openings is substantially the same.

In one or more embodiments, the pitch of the pattern can be in the range from about 1 µm to about 100 µm, particularly from about 2 µm to about 20 µm. In a specific embodiment, the pitch may be about 11 µm. In one or more embodiments, the lateral width of the bars or stripes between adjacent openings 12 can be in the range from about 0.1 µm to about 20 µm, particularly from about 0.5 µm to about 5 µm. In a specific embodiment, the lateral width may be about 1 µm to about 2 µm. The resulting resistance of the resistor portion, defined by the pattern of openings, is in one or more embodiments in a range from a few Ohm to about a few tens Ohm depending on the specific application.

A skilled person will appreciate that the openings can have any shape. For example, the openings can be of circular shape, hexagonal shape, square shape, rectangular shape, or octagonal shape to name few. In one or more embodiments, the grid-like pattern has a net structure having a plurality of interconnected bars or strips. The openings of the pattern are laterally completely surrounded by the material of the resistor portion. Unlike, for example, the source contact openings 47 of the gate portion 10, at least a portion, in many application most or all of the openings 12 of the grid-like pattern do not include conductive plugs which extends therethrough. As will become more apparent from the description below, conductive plugs also extend through the openings formed in the inactive cell region 3. The openings 12 of the grid-like pattern therefore differ in many embodiments from other openings formed in the common conductive layer in that they do not have any conductive plugs. This is, for example, illustrated in FIG. 2B. Therein, conductive plugs 49 extend through each of the source contact openings 47 while no conductive plugs extend through openings 12 arranged in the resistor portion 13.

In comparison with the gate portion 10, the resistor portion 13 has typically a higher sheet resistance. The pattern of openings 47 formed in the gate portion 10 leaves, in comparison with the pattern of openings 12 formed in the resistor portion 13, wider bars or bridges between adjacent openings 47 so that the effective sheet resistance of the gate portion 10 is only marginal affected. This becomes, for example, more apparent when referring to FIGS. 7A and 8A. These Figures illustrate different layouts of common conductive layers, i.e. the Gate-Poly. The pitch of the grid pattern in the gate portion 10 is the same as in the resistor portion 13. However, the size of the openings 12 in the resistor portion 13 is significantly larger than the size of the openings 47 in the gate portion 10 resulting in laterally thinner bars between adjacent openings 12. The resulting effective sheet resistance of resistor portion 13 is therefore higher than that of the gate portion 10.

Figure 2A:
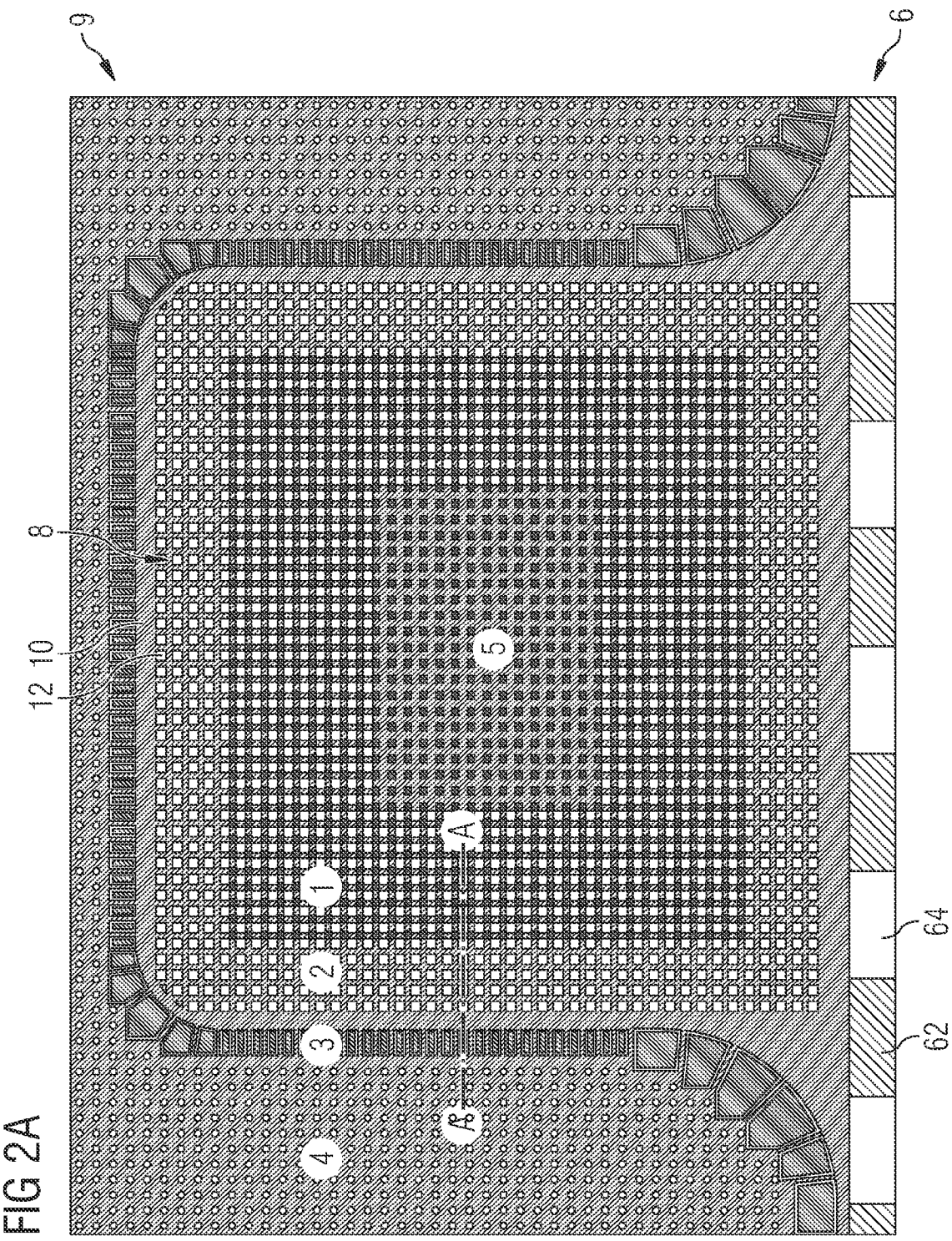
FIGS. 2A and 2B illustrate a top view and a cross-sectional view of a semiconductor device according to one or more embodiments.

The resistor portion 13 having an increased effective sheet resistance can be considered as forming a distributed resistor element different to a lump element. This allows, for example, that a large contact area can be provided between the resistor portion 13 and the gate portion 10. In some embodiments, the gate pad region 8 can be arranged at a corner of the semiconductor device 9. Typically, the gate pad region 8 can be of square or rectangular size. In this case, the contact area between the resistor portion 13 and the gate portion 10 extends along two sides of the gate pad region 8. FIG. 2A illustrates one embodiment, where the gate pad region 8 is formed at an edge of the semiconductor device 9 but not in the corner. In this case, the contact area between the resistor portion 13 and the gate portion 10 extends along three sides of the gate pad region 8. In other words, the resistor portion 13 is surrounded at least on two sides, particularly on three sides by the gate portion 10. In one or more embodiments, the pattern of openings 12 surrounds the contact region 1 of the resistor portion 13 at least on 70% of the lateral circumference of the contact region 1. The contact region 1 may have a hexagonal, rectangular, square, circular or any other shape. Irrespective of its shape, at least 70% of the circumference of the contact region 1 can be surrounded by the opening pattern 12. In some embodiments, pattern of openings 12 surrounds a gate bonding pad, when illustrated in a top view, at least on 70% of the lateral circumference of the gate bonding pad.

In one or more embodiments, pertaining to power semiconductor devices, the inactive cell region 3 is formed between the gate pad region 8 and the active cell region 1. Unlike active cells 51, inactive cells 52, for instance illustrated in Figure in FIGS. 2B and 3B, do not include a source region in this embodiment, hence the inactive cells 52 are incapable of providing a field-effect transistor function. The inactive cells 52 may include a body region 42 being electrically connected to a source metallization through body contact plugs 38. The inactive cells 52 can be designed to provide an electrical path for a reverse current in reverse mode of the semiconductor device. A skilled person will appreciate that the layout, arrangement and type of inactive cells can vary.

Typically, the inactive cell region 3 includes large body contact openings 39 formed in the common conductive layer through which the body contacts 38 extend. The body contact openings 39 leave small stripes or bars of the material of the common conductive layer between adjacent inactive cells 52. Here, "large contact openings" means large as compared to typical source contact openings 47 in the active cell region 4 or, in some embodiments, also in the gate pad region 8. The large contact openings 39 allow forming of electrical contacts to respective body regions 42 of the inactive cells 52. The small stripes or bars between adjacent body contact openings 39 in the inactive cell region 3 also contribute to the overall gate resistance. When designing the layout of the resistor portion 2, the resistance contributed by the inactive cell region 3 should be considered. Conductive plugs 38 extend through openings 39 for contacting respective body regions 42 of inactive cell 52.

The gate pad region 8 may include the contact region 1. The contact region 1 can be formed by a pad, which can be a portion of the common conductive region. In the embodiment illustrated in FIG. 1, the contact region 1 includes a continuous central portion, which is at least partially, typically completely, surrounded by the resistor region 2. Contact region 1, or pad, is designed for providing an electrical connection to the resistor region 2. Typically, a gate control voltage will be applied to the gates of the active cells 51. To this end, a gate bonding pad, or gate pad metallization, is formed on the semiconductor device 9. The gate bonding pad is exposed to allow external connection, for example, by pressing a bonding wire on the gate bonding pad. The gate bonding pad is in one or more embodiments arranged on the gate pad region 8, and typically partially or substantially completely covers the gate pad region 8. The contact region 1 and the resistor region 2 are arranged, in one or more embodiments, underneath the gate bonding pad. The gate bonding pad is insulated from the resistor region 2 and the contact region 1 by a pad insulating layer, which includes at least one, in one or more embodiments a plurality of openings formed in the pad insulating layer. The openings are filled with a conductive material and provide the electrical connection between the gate bonding pad and the integrated gate resistor formed by resistor portion 13 through the contact region 1. The resistor portion 13 therefore forms at least a part of an electrical connection between the gate bonding pad and the gates of the active cells 51. Resistor portion 13 therefore electrically connect gate bonding pad 18 through contact region 1 in series with gate portion 10. Typically, there is no other electrical connection between gate bonding pad 18 and gate portion 10 bypassing resistor portion 13.

For manufacturing, typically a common conductive layer is formed on semiconductor substrate 100; see, for example, FIGS. 2A and 3B. In one or more embodiments, the semiconductor substrate 100 is provided with a gate insulating layer 44 arranged in, and covering, the active cell region 4 and a field insulating layer 14 arranged in, and covering, the gate pad region 8. In many embodiments described herein, the field insulating layer 14 has a larger thickness than the gate insulating layer 44. A transition zone between the gate insulating layer 44 and the field insulating layer 14 is typically arranged in the inactive cell region 3 if present. The common conductive layer deposited on gate insulating layer 44 and field insulating layer 14 is subsequently structured to pattern the gate portion 10 and the resistor portion 13. For example, a gate mask is formed on common conductive layer, which is subsequently etched using the gate mask as etching mask.

In one or more embodiments described herein, the resistor portion 13 and the gate portion 10 remain electrically connected via portions 11 formed in the transition zone or the inactive cell region 3, respectively. Portions 11 may be the stripes between adjacent body contact openings 39 formed in the inactive cell region 3. In one or more embodiments, the resistor portion 13 and the gate portion 10 are separated from each other during structuring of the common conductive layer and are thus electrically insulated from each other. A separate electrical connection between these portions is subsequently formed, for example, by portions of a metallization such as a gate ring structure.

The integration of the resistor portion, i.e. of the integrated gate resistor, into the gate pad region 8 does not consume additional space of the semiconductor device; hence, the integration is very space-effective. Furthermore, the integrated gate resistor can be reliably formed. Different to lump resistor elements, the "distributed" gate resistor can tolerate variations of the manufacturing process. For example, a lump resistor element is typically connected to the gate portion by bridges formed in the level of the gate bonding pad metallization. To ensure that the bridges are not short-circuited with the gate bonding pad, i.e., to ensure that the bridges are fully separated form the gate bonding pad, additional contact pads for testing are provided which consume additional space. Short-circuiting may result from debris caused by the etching or removal of the respective masks.

Typically, the total gate resistance is mainly defined by the integrated gate resistor formed by resistor portion 13. Since resistor portion 13 is formed, in many embodiments described herein, on field insulation layer 14 only, the total gate resistance is "concentrated" in gate pad region 8. The effective sheet resistance of gate portion 10 is much smaller than the effective sheet resistance of resistor portion so that the voltage applied to gate bonding pad 18 can be evenly distributed over gate portion 10 as it becomes more apparent from the simulation described below.

The distributed integrated gate resistor as described herein can be formed to have a direct electrical connection with the gate portion, i.e. an integrally formed electrical connection in the common conductive layer. Therefore, no separate electrical connection is needed which avoids integration of an extra bonding pad for testing that the separate electrical connection is insulated from the gate bonding pad. Furthermore, since the integrated gate resistor formed by the patterned resistor portion 13 is electrically connected to the gate portion 10 along at least two sides or even at least three sides of its periphery, a large contact area is provided which ensures a reliable electrical connection different to lump elements which are often only connected at designated points. When considering FIG. 1, for example, the electrical connection between resistor portion 13 and gate portion 10 is formed by a plurality of stripes 11 running between adjacent body contact openings 39. Even if some of these stripes 11 were not properly formed, for example, due to manufacturing tolerances or etching inhomogeneities, a sufficient electrical connection is provided by the remaining stripes. Hence, the yield of manufacturing process is increased. The same applies to the formation of the pattern structure in the resistor portion 13. If, for example, some of the adjacent openings 12 merges, which would result in an interruption of the electrical connection at this point, the "web" formed in the resistor portion 13 ensures the functionality of the distributed gate resistor. The overall reliability of the semiconductor device 9 is therefore increased and the manufacturing costs decreased.

Figure 2B:
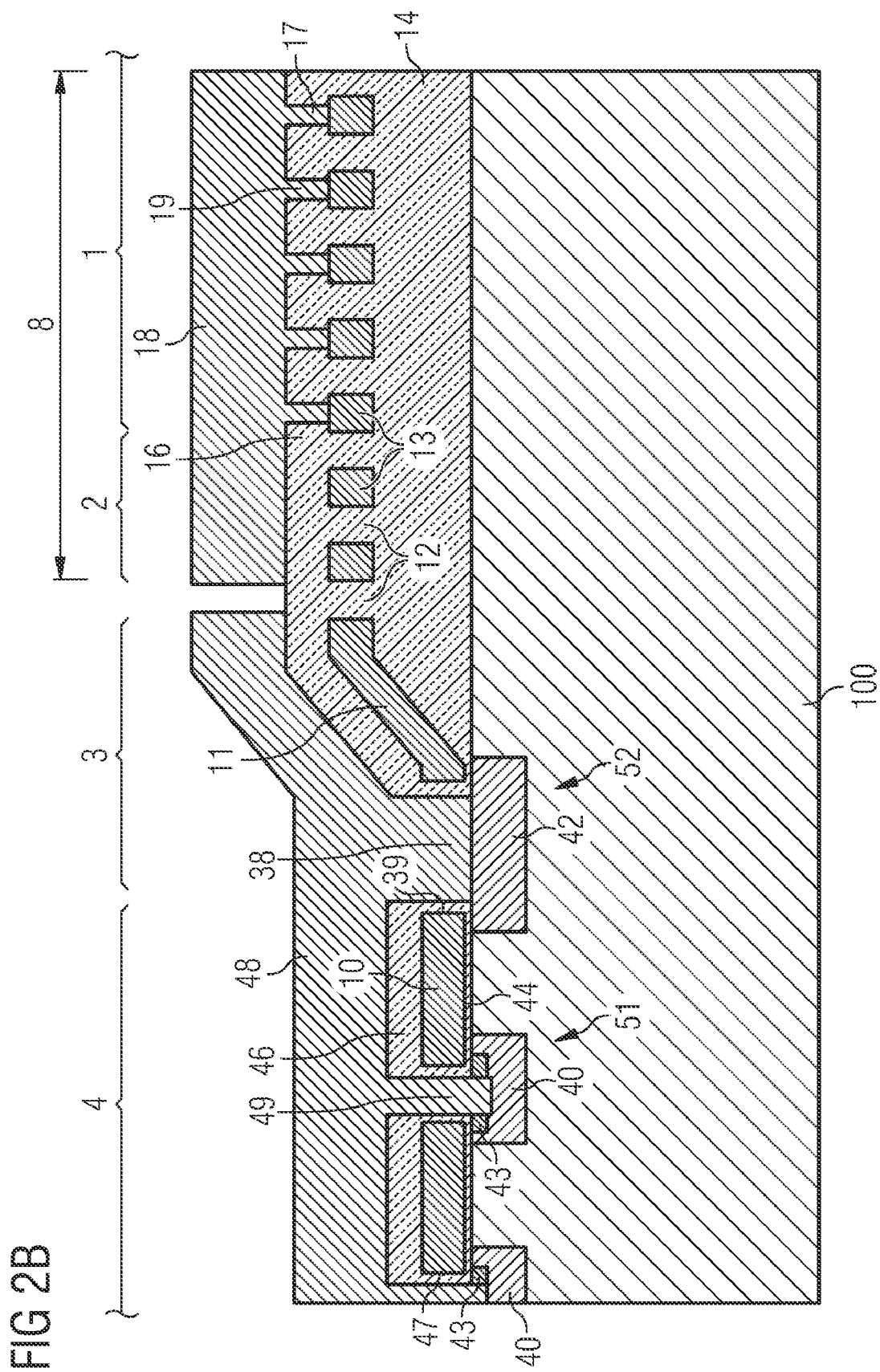
Figure 3A:
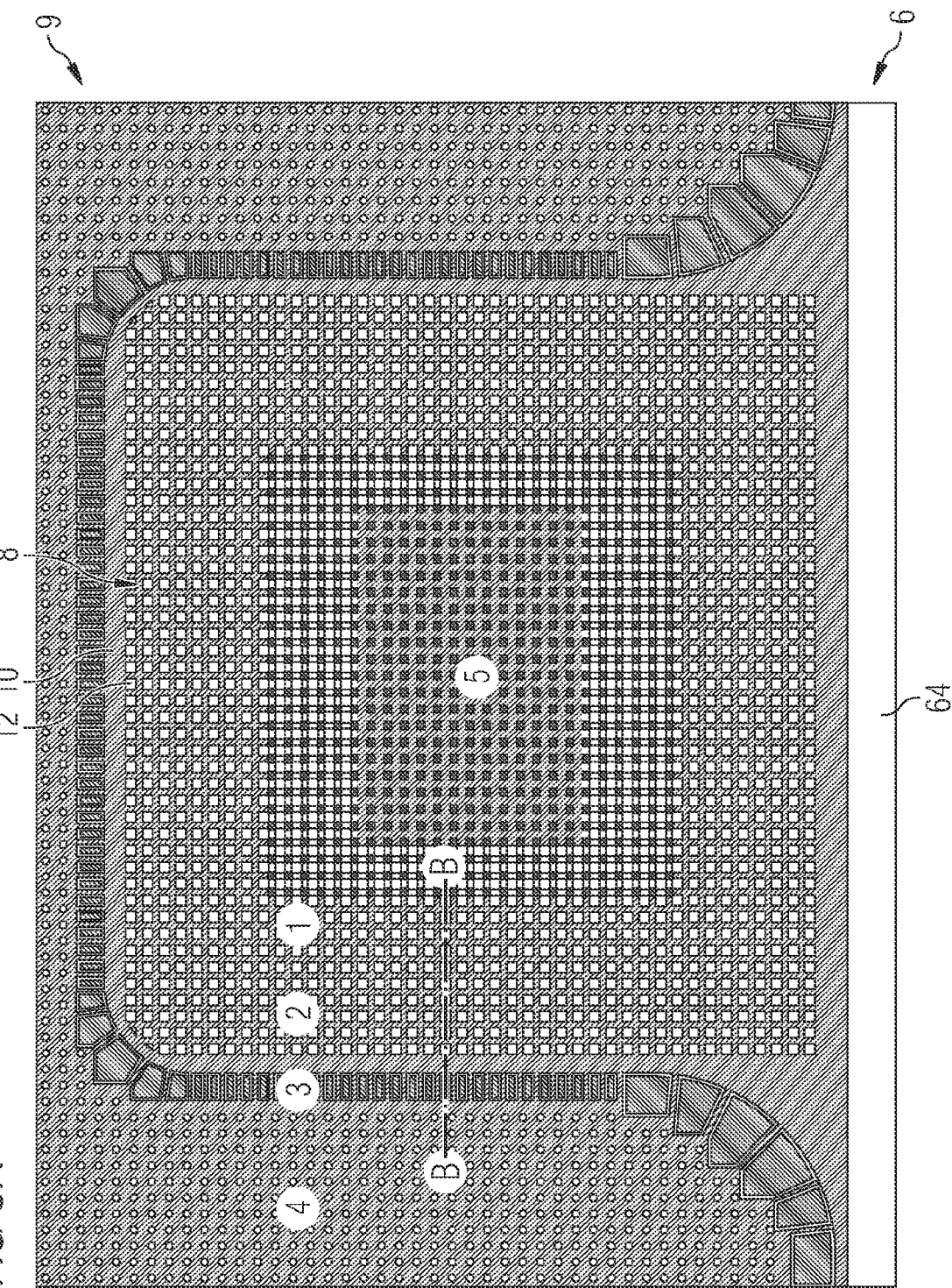

FIGS. 2A, 2B, 3A and 3B illustrate top views and cross-sectional views of embodiments described herein. FIGS. 2B and 3B illustrate respective sectional views of the line segment A-A in FIG. 2A and line segment B-B in FIG. 3A, respectively. A gate connection structure 8 for use in a semiconductor device is formed in the gate pad region. The gate connection structure 8 includes a resistor layer 13 having a contact portion 5. The resistor layer 13 is formed at least in the resistor region 2 of the gate pad region. A gate layer 10 is arranged in the active cell region 4 as described above. Resistor layer 13 and gate layer 10 can be portions of a common conductive layer. In some embodiments, resistor layer 13 and gate layer 10 are separated portions of a common conductive layer. The common conductive layer can be divided at least into the separate gate and resistor layers, for example, by structuring the common conductive layer. In some embodiments, resistor layer 13 and gate layer 10 may origin from different conductive layers. In one or more embodiments, gate layer 10 and resistor layer 13 are formed by a highly doped semiconductor layer, typically a highly doped polysilicon layer. In other embodiments, the semiconductor layer is made of a material selected from the group including polysilicon, polysilicide, metal, and composite layers having at least two layers of conductive material. In one or more embodiments, the semiconductor layer is a connected semiconductor layer. However, in a topological sense, the semiconductor layer is a non-simply connected layer in the gate connection structure 8, i.e., it typically has holes or openings. In some embodiments, the resistor layer 13 is arranged on a field insulating layer, e.g., a field oxide layer 14 as illustrated in FIG. 2B. In one or more embodiments, the field insulating layer 14 is a deposited or a thermal oxide layer. In other embodiments, the field insulating layer is made of other materials, such as silicon nitride.

The resistor layer 13 includes a contact region and a resistor region. A pattern of openings 12 is formed in the resistor layer 13, which pattern forms the resistor region. In one or more embodiments, the pattern of openings 12 is one of a lattice, a grid, a web, at least partly connected stripes or any combination thereof. In one or more embodiments, the pattern of openings 12 extends at least partially into the contact region 1. In FIGS. 2A and 2B, the contact region 1 also includes a portion of the pattern of openings 12 formed in the resistor layer 13 in an outer part of the contact region 1 while the resistor layer 13 is unstructured in the central contact portion 5 forming part of the contact region 1. In one or more embodiments, the resistor layer 13 is unstructured in the whole contact region 1. The whole contact region 1 or any part thereof may include the pattern of openings 12.

By using at least the resistor region 2, an effective sheet resistance is integrated in the gate connection structure 8. The functioning of the gate connection structure 8 with integrated sheet resistance according to one or more embodiments is not vulnerable to short-circuit, which may plague devices with external gate resistance. A special measuring pad for detecting device failure by short-circuits may therefore be omitted saving chip area and costs as described above. The integrated effective sheet resistance depends inter alia on the pattern of openings 12. The sheet resistance may depend on at least one of position, size and shape of openings in the pattern of openings 12. The sheet resistance may depend on material properties of the semiconductor layer and/or the relative size of the resistor region 2 and the contact region 1. By varying these geometric or material properties, the sheet resistance may be adapted to specific applications.

A gate pad insulating layer 16 is formed on the resistor layer 13 and includes at least one, typically a plurality of openings 17 formed therein. Gate pad insulating layer 16 can be made of any suitable insulating material such as silicon oxide. A skilled person will appreciate that other materials, such as silicon nitride, composite material and organic insulating materials can also be used. On gate pad insulating layer 16, a gate bonding pad 18 is formed which typically covers most of the gate connection structure 8 including most of the resistor region 2. The gate bonding pad 18 is electrically connected through selected openings 17 formed in the gate insulating layer 16 by using conductive plugs 19. Gate bonding pad 18 may be a connected bonding pad.

Active cell region 4 includes active cells 51. Each active cell 51 includes a body region 40 formed in the semiconductor substrate 100. The semiconductor substrate or body 100 can be made of any semiconductor material suitable for manufacturing a semiconductor device. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

The semiconductor substrate 100 can be a single bulk mono-crystalline material. It is also possible, that the semiconductor substrate 100 includes a bulk mono-crystalline material and at least one epitaxial layer formed thereon. Using epitaxial layers provides more freedom in tailoring the background doping of the material since the doping concentration can be adjusted during deposition of the epitaxial layer or layers.

The semiconductor substrate 100 is typically of first conductivity type, i.e. of n-type in many embodiments described herein. Body region 40 is of the second conductivity type, i.e. of p-type. Embedded in body regions 40, highly doped source regions 43 of first conductivity type are formed. Typically, the body regions 40 and the source regions 43 in the active cell region 4 form field-effect transistor structures together with gate layer 10 acting as gate electrode.

In one or more embodiments, a substrate wafer having the desired background doping concentration is provided. Body region 40 and source region 43 are formed by implantation at the top surface. If desired, the substrate wafer can be thinned at a bottom surface before a not illustrated drain region or emitter region is formed by implantation at the bottom surface. It would also be possible to thin the substrate wafer before implanting source and body regions if such thinned substrate wafers can reasonably handled. By using any of these approaches, an expensive epitaxial deposition is avoided.

On the top surface of semiconductor device 100 a gate insulating layer 44 is formed, which can be, for example, a thermal oxide. Gate insulating layer 44 is covered by patterned gate layer 10, which in turn is covered by insulating layer 46. A source metallization 48 is formed on the insulating layer 46. Source metallization 48 also forms in many embodiments a source bonding pad. Source metallization 48 is electrically connected through source contact plugs 49 arranged in the source contact openings 47 as described above.

Between the active cell region 4 and the gate connection structure 8 a transition zone can be arranged which is provided, for example, by inactive cell region 3. Inactive cell region 3 includes inactive cells 52 as described above. Stripes 11 are formed integrally with resistor layer 13 and gate layer 10 and electrically connect these layers with each other. The inactive cell region 4 at least partly surrounds the gate connection structure 8, e.g., on one, two, three or all sides. In FIGS. 2A and 2B, the inactive cell region 3 surrounds the gate connection structure on three sides, while two sides would be typical if the gate connection structure 8 is arranged in a corner of the semiconductor device 9. As described above, large body contact openings 39 are formed in gate insulating layer 44 and insulating layer 46, respectively, through which body contact plugs 38 extend for contacting body regions 42 of inactive cells 52.

Gate insulating layer 44 and field insulating layer 14 are typically formed separately. Field insulating layer 14 may also include, as a thin layer, gate insulating layer extending to the gate pad region.

Insulating layer 46 and gate pad insulating layer 16 are typically formed and structured together but can also be formed and structured separately.

Gate pad metallization forming gate bonding pad 18 and source metallization forming source bonding pad 48 are also typically formed together by depositing a suitable conductive material. Suitable electrically conductive materials include, without being limited thereto, highly doped polysilicon, aluminium, aluminium alloy, copper, copper alloy, nickel alloys, metal compositions, metal alloys and multilayer metallizations including a barrier or contact layer such as a titanium nitride layer and a metal layer. In some embodiments, the gate pad and source metallization include an AlSiCu alloy. After deposition, the deposited layer is structured to separate the gate bonding pad 48 from the source bonding pad 18. Subsequent test may be performed to verify that these pads are reliably separated and insulated from each other.

The openings 17 and 47 provided in gate insulating layer 16 and insulating layer 46, respectively, are typically formed together by etching. The respective plugs 19, 49 and 39 are also typically formed together. In one or more embodiments, the plugs 19, 39 and 49 are made of, for example, tungsten or highly doped polysilicon. In one or more embodiments, the plugs 19, 39, 49 are formed of the material of the source metallization 48.

FIGS. 3A and 3B illustrate embodiments, wherein the resistor region 2 is larger as compared to the resistor region 2 of FIGS. 2A and 2B, while the contact region 1 illustrated in FIG. 3B is smaller than the contact region 1 illustrated in FIG. 2B. FIGS. 3A and 3B therefore illustrate a gate connection structure with an integrated gate resistor having a higher resistance than integrated gate resistor of FIGS. 2A and 2B. While the embodiments of FIGS. 2A, 2B, 3A and 3B exhibit the same effective sheet resistance due to the same grid-like pattern, the total resistance of the integrated gate resistor is defined by the extend of the contact region defined by the number of, and the area covered by, the conductive plugs 19 formed in the gate insulating layer 16 to provide electrical connection between the gate bonding pad 18 and the resistor layer 13. This illustrates that in both embodiments the same gate mask has been used while only the plug mask for defining the number and location of the gate pad contact plugs was adapted according to specific needs. Hence, devices with different gate resistor can be formed by merely adapting the plug mask used for defining and etching contact openings 17, body contact openings 39 and source contact openings 47, respectively.

In one or more embodiments, the resistor region 2 surrounds the contact region at least on two, three or all sides. The resistor region 2 may surround the contact region 1 on at least 50%, 70% or 75% of the circumference of the contact region 1. In FIGS. 2A and 3A, the resistor region 2 surrounds the contact region 1 completely, i.e., on four sides. Surrounding the contact region 1 at least on two sides, particularly at least on three sides also contributes to the homogeneity of the electric current spread and the reliability of the electrical connection.

Optionally, a gate ring structure or gate runner structure 6 is provided and illustrated in FIGS. 2A and 3A, respectively. In FIGS. 2A and 3A the gate ring structure 6 extends on one side of the gate connection structure 8. The gate ring structure 6 together with gate fingers may be used to distribute the gate voltage more homogeneously over an active cell area 4. The gate runner structure 6 will be described below with reference to FIG. 5.

While FIGS. 2B and 3B illustrate active cells with planar layout, alternatively a vertical layout using trench technology can be used in further embodiments. While the gate layer 10 has been described as a portion of a common conductive layer which also includes the resistor layer 13 and the stripes 11, different semiconductor layers, e.g., of different materials, geometries and sizes such as thickness may be used in the respective regions.

FIGS. 4A and 4B illustrate simulations of the electrical potential distribution over the gate layer 10 of a reference device having no integrated gate resistor and a device having an integrated gate resistor as described herein. A schematic gate connection structure with virtually no resistor region 2 is illustrated in the top part of FIG. 4A while the top part of FIG. 4B illustrates a gate connection structure with a large resistor region 2. In the respective bottom parts of FIGS. 4A and 4B, respectively, corresponding simulated distributions of the electrical potential are illustrated at a certain time during turn-on of the semiconductor device, where equilibrium has not yet been reached. In the bottom part of FIG. 4A, corresponding to the gate connection structure with virtually no integrated gate resistor, the electrical potential applied to the gate connection structure has reached out farther into the gate layer 10 as compared to the bottom part of FIG. 4B, corresponding to the gate connection structure with large resistor region 2 at the same time during turn-on. As illustrated by this simulation, the integrated gate resistor provides for a homogeneous distribution of the voltage applied to the gate pad and acts as resistor to delay charging the gate which reduces the likelihood that oscillations are excited.

Figure 5:
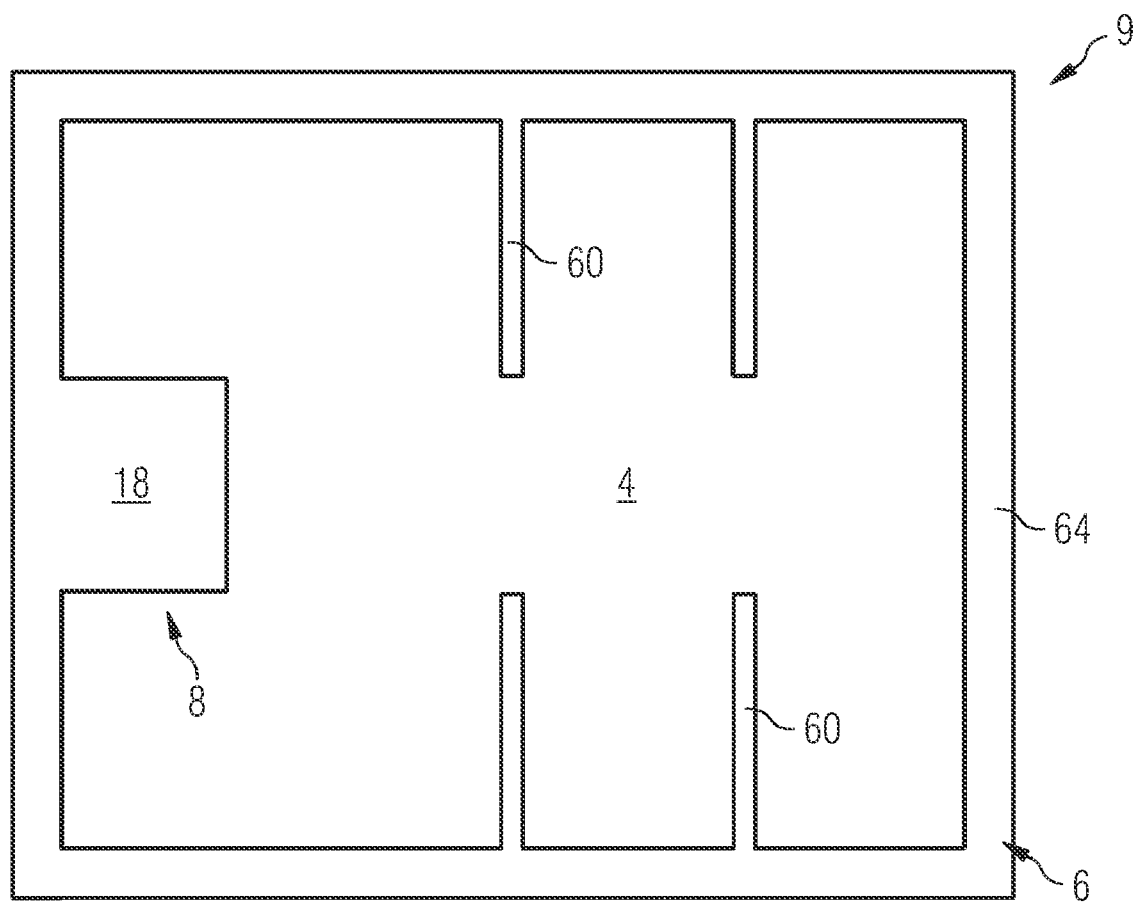
FIG. 5 illustrates a top view of a semiconductor device with gate ring structure according to one or more embodiments.

FIG. 5 illustrates embodiments of a semiconductor device 9 with gate ring or gate runner structure 6. In FIG. 5, the gate runner structure 6 surrounds the active cell area 4 and the gate connection structure 8. The gate runner structure 6 with gate fingers 60 may help to distribute a gate voltage applied to the gate connection structure 8 more evenly in the active cell area 4, e.g., in a semiconductor device with large active cell area 4. The gate runner structure 6 may include different portions such as at least one low electrical resistance portion, e.g., made from metal, and at least one high electrical resistance portion, e.g., made from semiconductor material, or vice versa. The electrical resistance of the gate runner structure 6 may be adjusted, for example, by the geometry, size or material of its portions. The gate runner or gate ring structure 6 may also be formed by a low electrical resistance portion 64 only, as illustrated in FIG. 5, particularly if the integrated gate resistor described herein is adjusted to define the total gate resistance. A gate runner structure 6 including only low resistance portions 64 is also illustrated in FIG. 3A, while FIG. 2A illustrates a portion of a gate runner structure 6 including low and high resistance portions 62, 64.

FIG. 6 illustrates one embodiment where the resistor layer 13 is separate from the gate layer 10, i.e. that no integral electrical connections are formed in the common conductive layer between these two layers. Instead, resistor layer 13 is electrically connected to gate layer 10 via a low resistance portion 64 of a gate ring or gate runner structure. As can be seen in FIG. 6, low resistance portions 64 of gate ring structure 6 are separate portions of the metallization layer, which was structured to form gate bonding pad 18 and source bonding pad 48. Electrical connection to low resistance portions 64 is provided by respective plugs formed in the insulating layer 16 and 46, respectively. Low resistance portion 64 can also be formed at other portions of the semiconductor substrate, for example, as illustrated in FIG. 5.

FIGS. 7 to 10 illustrate several embodiments of semiconductor devices having integrated gate resistors with different resistance. In FIGS. 7A, 8A, 9A and 10A, the layout of the patterned common conductive layer is illustrated while FIGS. 7B, 8B, 9B and 10B illustrates additionally the conductive plugs 19 for connecting the resistor portion 13 of the common conductive layer. In FIGS. 7A, 8A and 9A the resistor portion 13 include respective patterns of openings having the same pitch which also corresponds to the pitch of source contact openings 47 in gate layer 10. In fact, the layout of the structured common conductive layer is identical in FIGS. 7A and 8A. A different gate resistor is, however, obtained by varying the size of the contact region 1 which is defined by the number of, and the size of the area covered by, the conductive plugs 19. In FIG. 7B, the area covered by the plugs 19 is significantly larger than in FIG. 8B leaving to a higher gate resistance in FIG. 8B. This illustrates that the final gate resistance can be selected by the size of the contact region 1 defined by plugs 19 even when identically patterned gate portions 13 are used. Only the mask for defining the layout of the conductive plugs (plug mask) needs to be changed when different gate resistances are desired for different applications. This also significantly reduces the cost of manufacturing.

Figure 8A:
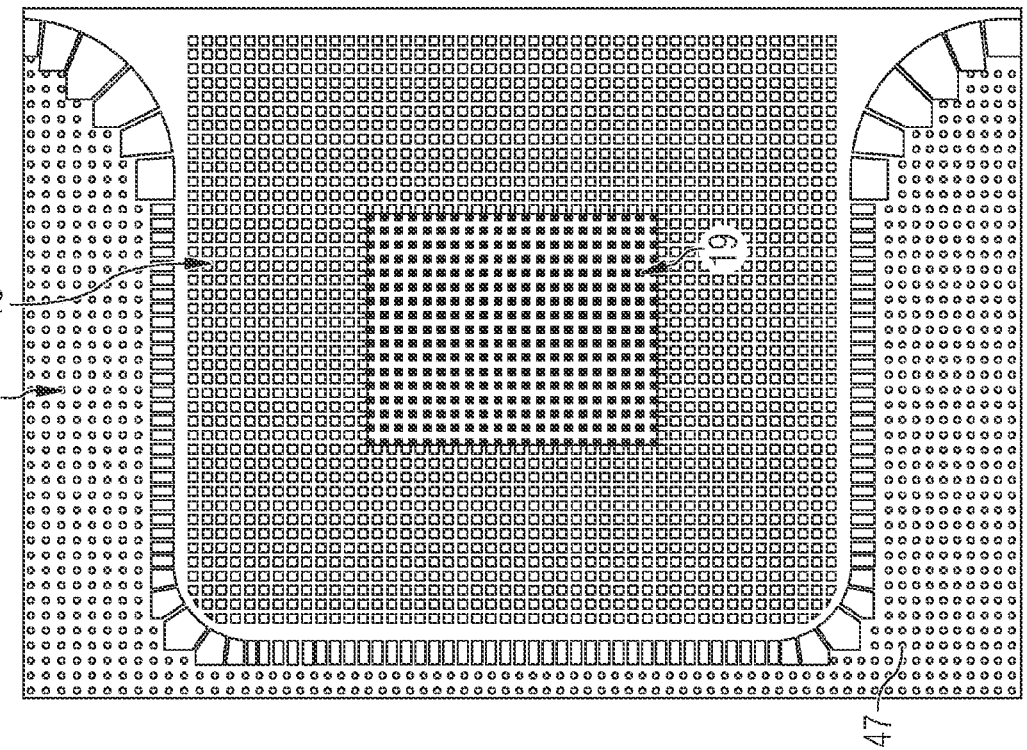
FIGS. 8A and 8B illustrate a semiconductor device with an integrated gate resistor having a medium resistance according to one or more embodiments.
Figure 8B:
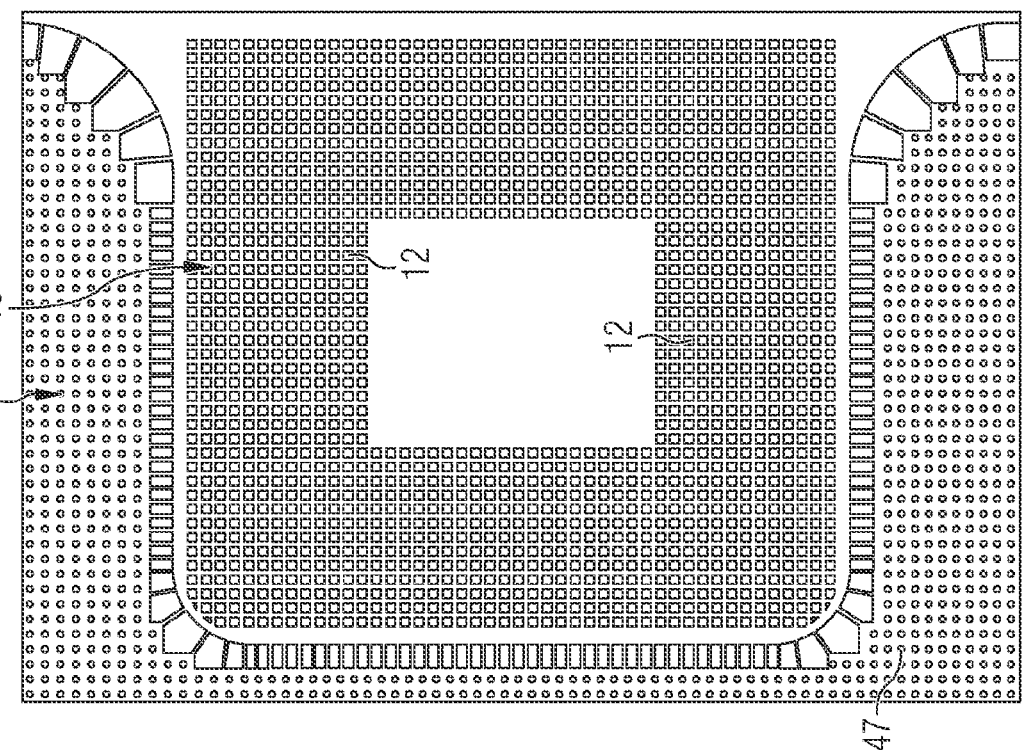
Figure 9A:
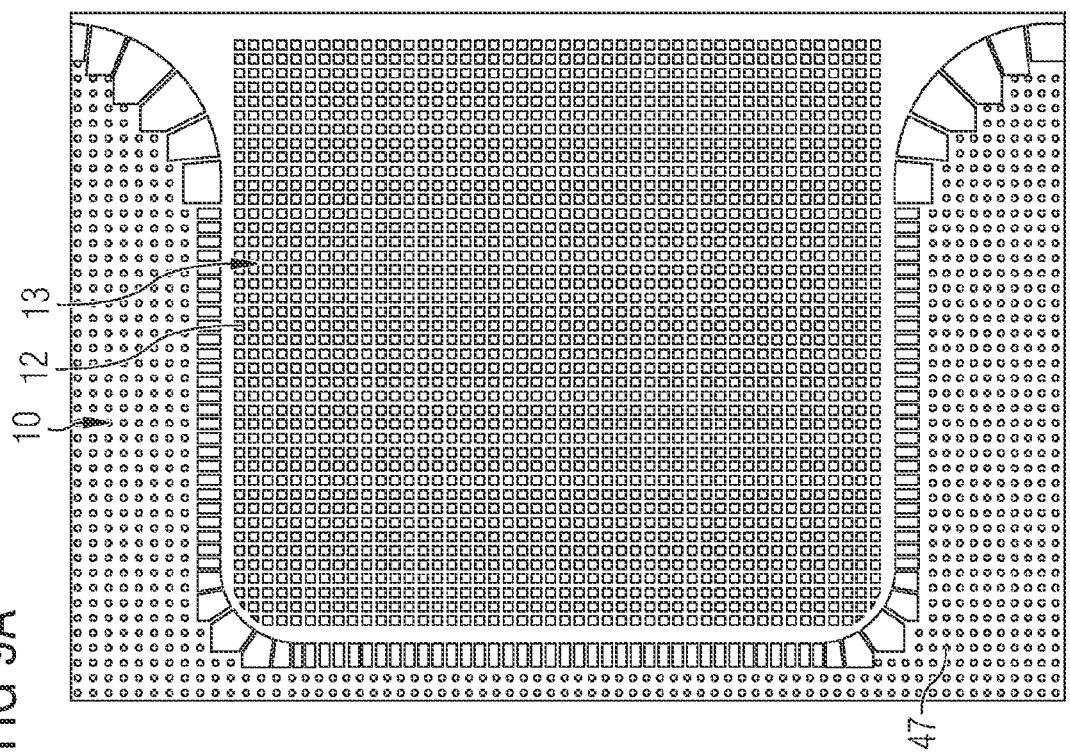
FIGS. 9A and 9B illustrate a semiconductor device with an integrated gate resistor having a high resistance according to one or more embodiments.
Figure 9B:
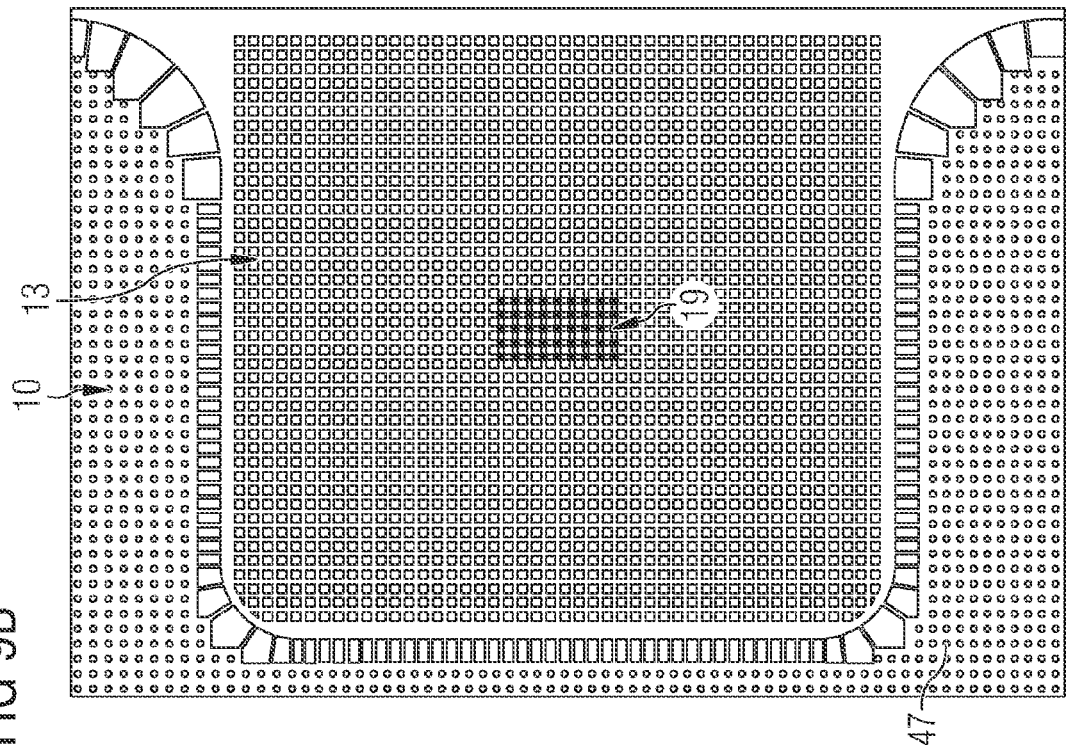
Figure 10B:
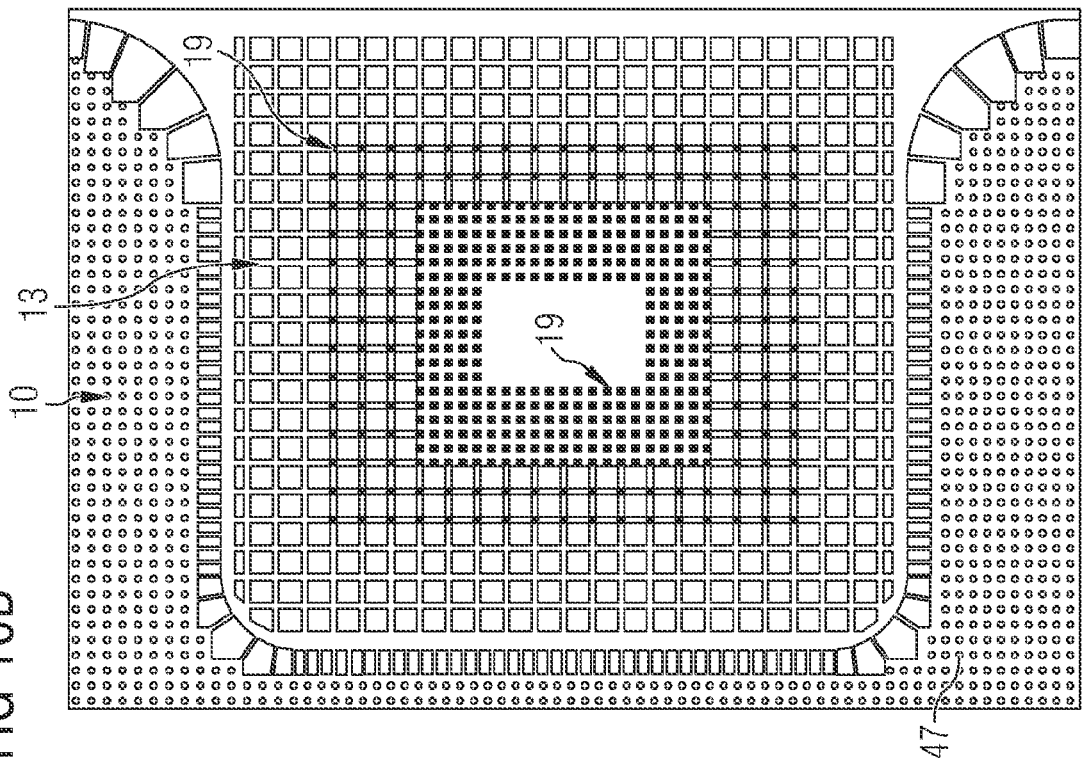
FIGS. 10A and 10B illustrate a semiconductor device with an integrated gate resistor having a high resistance according to one or more embodiments.
Figure 10A:
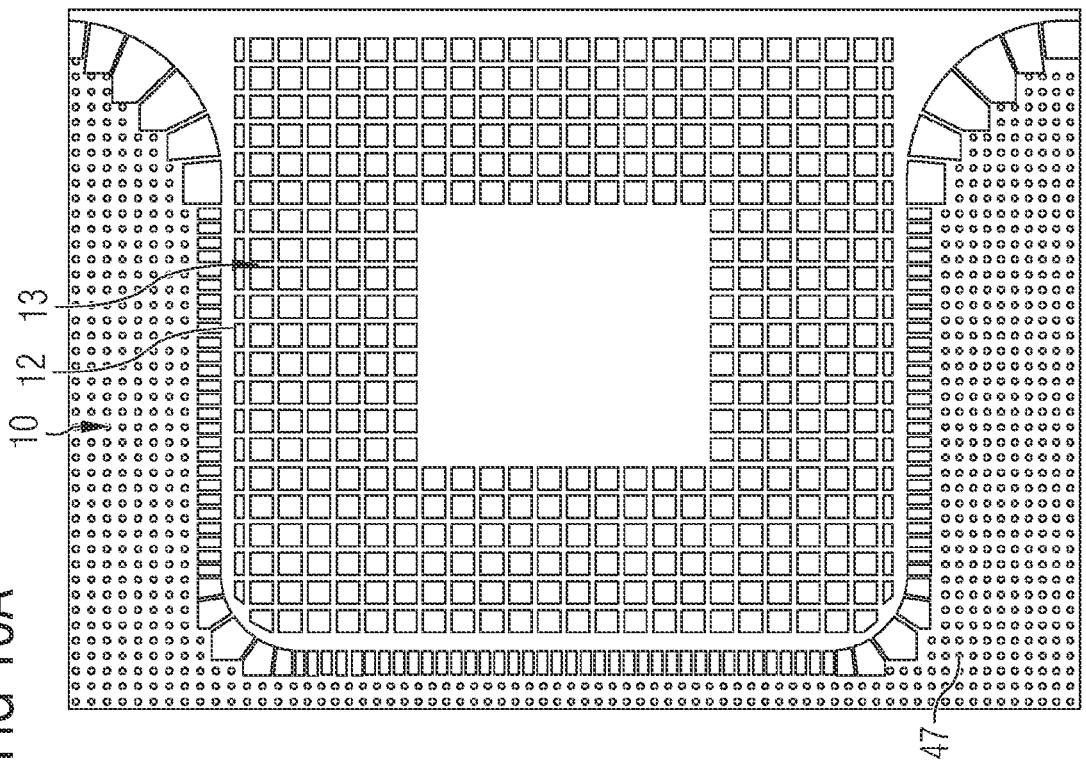

The embodiment illustrated in FIGS. 9A and 9B expands this concept to a resistor portion 13, which is completely covered, i.e. does not include a compact or central pad as, for example, illustrated in FIGS. 7A and 8A. When further restricting the size of the contact region 1 defined by the conductive plugs 19, an even higher gate resistance can be obtained. However, in the embodiments described above, the patterned resistor portion 13 provides for a homogeneous distribution of the current towards the gate portion 10.

FIG. 10A illustrates the layout of a common conductive layer having a resistor portion or resistor layer 13 with a pitch being twice as large as the pitch of the gate portion or gate layer 10. This increases the effective sheet resistance in comparison to the effective sheet resistance of gate portion 13 of FIGS. 7A, 8A and 9A, respectively.

It would also be possible to use a varying pattern or locally adapted pattern of openings in the gate portion 13 to compensate, for example, inhomogeneities of the current spread in the gate portion 13 due to geometrical constraints such as corners. In some embodiments, a portion of the openings is spaced by a first pitch while another portion is spaced by a second pitch being different to the first pitch. In one or more embodiments, the pitch increase stepwise, for example, from the contact region 1 towards the active cell region. In one or more embodiments, the openings have different shape or size. A skilled person will appreciate that by selecting appropriate shape, size and pitch, or by combining openings of different shape, size or pitch, the current spread within the resistor layer and towards the gate portion 10 can be adapted and improved to obtain, for example, a homogeneous current spread.

The written description above uses specific embodiments to disclose the invention, including the best mode, and also to enable any person skilled in the art to make and use the invention. While the invention has been described in terms of various specific embodiments, those skilled in the art will recognise that the invention can be practiced with modification within the spirit and scope of the claims. Especially, mutually non-exclusive features of the embodiments described above may be combined with each other. The patentable scope is defined by the claims and may include other examples that occur to those skilled in the art. Such other examples are intended to be within the scope of the claims if they have structural elements, which do not differ from the literal language of the claims, or if they include equivalent structural elements with insubstantial differences from the literal languages of the claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   an active cell region and a gate pad region;
   a conductive gate layer arranged in the active cell region;
   a conductive resistor layer arranged in the gate pad region and comprising a resistor region which comprises a grid-like pattern of openings formed in the resistor layer;
   a gate pad metallization arranged at least partially above the resistor layer and being in electrical contact with the resistor layer; and
   an electrical connection between the gate layer and the gate pad metallization, wherein the electrical connection comprises the resistor region.

2. The semiconductor device of claim 1, further comprising an inactive cell region arranged between the active cell region and the gate pad region.

3. The semiconductor device of claim 1, further comprising:
   an insulating layer arranged at least on the resistor layer; and
   at least one opening above a contact region of the resistor layer.

4. The semiconductor device of claim 3, wherein the insulating layer comprises a pattern of openings filled with an electrically conductive material to connect electrically the gate pad metallization with the resistor layer, wherein the pattern of openings defines the contact region of the resistor layer.

5. The semiconductor device of claim 3, comprising wherein the resistor region surrounds the contact region of the resistor layer at least on two sides.

6. The semiconductor device of claim 1, further comprising:
   a semiconductor substrate, a gate insulating layer arranged between the gate layer and the semiconductor substrate; and
   a field insulating layer arranged between the resistor layer and the semiconductor substrate.

7. The semiconductor device of claim 1, comprising wherein the resistor layer and the gate layer are portions of a common conductive layer.

8. The semiconductor device of claim 7, wherein the common conductive layer comprises a material selected from a group containing polysilicon, polysilicide, metal, and composite layers comprising at least two layers of conductive material.

9. The semiconductor device of claim 1, wherein the electrical connection between the gate layer and the resistor layer further comprises a gate ring structure.

10. The semiconductor device of claim 1, wherein the electrical connection between the gate layer and the resistor layer further comprises a polysilicon connection structure.

11. A semiconductor device, comprising:
   an active cell region, a gate pad region, and an inactive cell region arranged between the active cell region and the gate pad region;
   a conductive gate layer arranged in the active cell region;
   a gate connection structure arranged in the gate pad region and comprising a conductive resistor layer, a gate pad metallization and a gate pad insulating layer between the resistor layer and the gate pad metallization, the resistor layer comprising a grid-like pattern of openings formed in the resistor layer;
   the gate pad insulating layer comprising at least one opening defining a contact region of the resistor layer,
   the gate pad metallization being in electrical contact with the contact region through the at least one opening, and
   the grid-like pattern of openings forming at least a portion of an electrical connection between the gate layer and the contact region of the resistor layer.

12. The semiconductor device of claim 11, comprising wherein the resistor layer and the gate layer are portions of a common conductive layer extending from the gate pad region to the active cell region.

13. The semiconductor device according to claim 11, comprising wherein the grid-like pattern of openings surrounds at least 70% of the circumference of the contact region of the resistor layer.

14. A semiconductor device, comprising:
   an active cell region and a gate pad region;
   a conductive layer extending from the gate pad region to the active cell region and comprising a gate portion arranged in the active cell region and a resistor portion arranged in the gate pad region, the resistor portion comprising an array of openings formed in the conductive layer and defining an effective sheet resistance of the resistor portion which is higher than an effective sheet resistance of the gate portion;
   a gate pad metallization; and
   a gate pad insulating layer between the resistor portion and the gate pad metallization, the insulating layer comprising a plurality of conductive plugs electrically connecting the resistor portion with the gate pad metallization;
   wherein the array of openings portion forms at least a portion of an electrical connection between the gate portion and the gate pad metallization.

15. The semiconductor device of claim 14, further comprising:
   an inactive cell region arranged between the active cell region and the gate pad region.

16. A semiconductor device, comprising:
   a plurality of field-effect transistor cells;
   a conductive gate layer forming respective gates of the respective field effect-transistor cells;
   a gate bonding pad;
   an electrical connection between the gate layer and the gate bonding pad, the electrical connection comprising a resistor structure comprising a grid-like pattern of openings formed in a resistor layer, wherein the grid-like pattern is at least partially arranged below the gate bonding pad.

17. The semiconductor device of claim 16, further comprising a semiconductor substrate, a gate insulating layer comprising a first thickness and being arranged between the gate layer and the semiconductor substrate, and a field insulating layer comprising a second thickness and being arranged between the resistor layer and the semiconductor substrate, wherein the second thickness is larger than the first thickness.

18. The semiconductor device of claim 16, further comprising:
    a regular pattern of source contact openings formed in the gate layer; and
    a plurality of conductive source contact plugs extending through the respective source contact openings and being insulated from the gate layer.

19. The semiconductor device of claim 16, further comprising:
    a plurality of conductive gate bonding pad plugs forming an electrical connection between the resistor layer and the gate bonding pad, the gate bonding pad plugs defining, in a top view on the resistor layer, a contact region of the resistor layer,
    wherein the contact region is surrounded, in top view on the resistor layer, by the grid-like pattern formed in the resistor layer at least on three sides.

20. A method of manufacturing a semiconductor device, comprising:
    providing a semiconductor substrate comprising an active cell region and a gate pad region;
    forming a conductive gate layer in the active cell region and a conductive resistor layer in the gate pad region,
    forming a grid-like pattern of openings in the resistor layer for forming a resistor region in the resistor layer;
    forming an insulating layer on the resistor layer;
    forming at least one opening in the insulating layer, wherein the at least opening defines a contact region of the resistor layer; and
    forming a gate pad metallization on the insulating layer in electrical contact with the contact region through the at least one opening, wherein the gate pad metallization is formed at least partially above the grid-like pattern of openings in the resistor layer.

21. The method of claim 20, wherein forming the gate layer and the resistor layer comprises:
    forming a common conductive layer in the active cell region and the gate pad region;
    forming a mask on the common conductive layer, wherein the mask defines the shape of the gate layer, the resistor layer and the grid-like pattern of openings; and
    structuring the common conductive layer to form the gate layer, the resistor layer, and the grid-like pattern of openings using the mask.

22. The method of claim 21, wherein structuring the common conductive layer comprises forming an electrical connection between the resistor layer and the gate layer.

23. The method of claim 20, further comprising:
    forming a gate ring metallization structure for providing an electrical connection between the gate layer and the resistor layer.

24. The method of claim 20, further comprising:
    forming a gate insulating layer comprising a first thickness in the active cell region; and
    forming a field insulating layer comprising a second thickness being larger than the first thickness in the gate pad region;
    wherein the gate layer is formed on the gate insulating layer and the resistor layer is formed on the field insulating layer.

25. The method of claim 20, wherein forming at least one opening in the insulating layer comprises:
    forming a plurality of openings in the insulating layer for defining the contact region of the resistor layer; and
    forming conductive plugs in the insulating layer, which are in contact with the resistor layer, wherein the grid-like pattern of openings formed in the resistor layer surrounds, in a top view on the resistor layer, at least 70% of the circumference of the contact region.

* * * * *